United States Patent [19]

Schumacher, III

[11] Patent Number: 4,721,550

[45] Date of Patent: Jan. 26, 1988

[54] PROCESS FOR PRODUCING PRINTED CIRCUIT BOARD HAVING IMPROVED ADHESION

[75] Inventor: John E. Schumacher, III, Boulder, Colo.

[73] Assignee: New West Technology Corporation, Boulder, Colo.

[21] Appl. No.: 859,834

[22] Filed: May 5, 1986

[51] Int. Cl.[4] .......................... C25D 5/02; C25D 5/54
[52] U.S. Cl. ..................................... 204/15; 204/38.4
[58] Field of Search ................... 204/15, 38.4, 40, 20, 204/30

[56] References Cited

U.S. PATENT DOCUMENTS

| | | | |
|---|---|---|---|
| 2,984,595 | 5/1961 | Schumpelt et al. | 204/15 |
| 3,294,654 | 12/1966 | Norman | 204/38.4 |
| 4,077,854 | 3/1978 | Estep | 204/38.4 |
| 4,153,518 | 5/1979 | Holmes | 204/38.1 |
| 4,167,601 | 9/1979 | Beckenbaugh et al. | 204/38.4 |
| 4,228,213 | 10/1980 | Bechenbaugh et al. | 204/38.4 |

*Primary Examiner*—T. M. Tufariello
*Attorney, Agent, or Firm*—Robert E. Harris

[57] ABSTRACT

A process is disclosed for forming a printed circuit board having improved adhesion of an electrically conductive layer to an underlying dielectric surface. A thin adhesive layer, or film, of conductive material (normally copper) is sputtered onto a dielectric substrate and through holes formed therein, after which the substrate, with the then amorphous sputtered layer thereon, is further processed in a manner so as not to damage adhesion of the sputtered layer to the substrate. The initial step of this further processing can be accomplished chemically or mechanically, and preferably is accomplished by electroplating a buffer, or transition, layer of conductive material onto the sputtered layer with the buffer layer being deposited by placing the substrate, having the sputtered layer thereon, in a first electroplating bath to produce an electroplated layer having no deposit stress or a slightly compressive deposit stress. Additional plating is thereafter carried out in a second electroplating bath having high throwing power, as is needed for plating inside holes for printed circuit applications, and this produces an electroplated layer having tensile deposit stress to thereby provide a uniform conductive material on the substrate and through the holes that is suitable for providing the electrically conductive traces of a printed circuit.

15 Claims, No Drawings

PROCESS FOR PRODUCING PRINTED CIRCUIT BOARD HAVING IMPROVED ADHESION

FIELD OF THE INVENTION

This invention relates to printed circuit boards, and, more particularly, relates to printed circuit boards having improved adhesion of electrically conductive layers to a dielectric surface without requiring the use of conventional adhesives.

BACKGROUND OF THE INVENTION

Processes for forming printed circuit boards are well known, and such boards are known to commonly include dielectric sheets, or substrates, the surfaces of which have electrically conductive layers adhered thereto, commonly utilizing adhesives, prior to forming, from such layers of conductive material, the required pattern of conductors, commonly known as "traces".

It is also known that the surfaces of the walls of holes in printed circuit boards can be plated during deposit of conductive material on other surfaces of a substrate. In so doing, it has been common to initially deposit conductive material on the substrate after drilling of holes in the board, which results in plating through the holes. The conductive pattern was then normally thereafter formed, as for example, by imaging using photographic techniques, applying resists selective to the imaging, and then etching away the unwanted portions of the conductive layers on the substrate.

In electroplating copper onto a substrate, it has heretofore been common to immerse the board in a high throwing power acid-copper sulfate bath (rather than in a standard composition acid-copper sulfate bath which has not been found to be acceptable for forming printed circuit boards). While a layer of copper has thus been deposited on the substrate, it has been found that such a layer often does not adhere to the substrate in an acceptable manner.

The problem of adhering a conductive layer to a dielectric substrate is discussed, for example, in U.S. Pat. No. 3,293,109, wherein it was suggested that improved bonding could be achieved using copper-copper oxide particles deposited in random clusters as a surmounting strata.

Sputtering of conductive material onto a dielectric material is also known, and such deposition is described, for example, in *Thin Film Process,* 1978, Academic Press, Inc., Chapter 11-4, Robert K. Watts. Sputtering has heretofore been used in connection with application for industrial coatings, thin film electronics, integrated circuits, print heads and other miscellaneous applications.

Processes for forming printed circuit boards using successive steps for deposition of conductive materials are shown, for example, in U.S. Pat. No. 3,294,654. In addition, processes for forming printed circuit boards utilizing successive sputtering steps for conductive layer deposition is shown, for example, in U.S. Pat. Nos. 4,077,854 and 4,455,181, and electro-deposit of a conductive material over a sputtered film is also shown, for example, in U.S. Pat. No. 4,077,854.

The use of a thin film barrier layer between a substrate and a vacuum-deposited metallic layer, with the metallic layer then having a further metallic layer electroplated thereon, is shown, for example, in U.S. Pat. No. 4,153,518, and stressing of individual layers on a substrate is shown, for example, in U.S. Pat. No. 2,984,595, with deposition of a stress free elecrtoless copper deposit being shown, for example, in U.S. Pat. Nos. 4,167,601 and 4,228,213.

Thus, while many different processes have heretofore been suggested for depositing conductive layers onto a substrate in forming a printed circuit board, there still often remains the problem of satisfactory adherence of such layers to the substrate.

SUMMARY OF THE INVENTION

This invention provides a process for improving the adherence of electrically conductive layers to a dielectric surface, or substrate, and does not necessitate the use of adhesives. A buffer, or transition, layer having compressive or neutral deposit stress is electroplated onto a sputtered layer deposited onto the substrate to create a crystalline structure in the amorphous sputtered layer that is suitable for allowing subsequent appliction of a lyer of electrically conductive material having non-compressive, or tensile, deposit stress, which layer is deposited in a second electroplating bath to build the electrically conductive material on the substrate and in the holes to the desired thickness.

It is therefore an object of this invention to provide a process for forming a printed circuit board having improved adhesion of electrically conductive layers to an electrically non-conductive surface.

It is another object of this invention to provide an improved process for forming a printed circuit board having a buffer, or transition, layer between a sputtered conductive layer and a electroplated conductive layer.

It is still another object of this invention to provide an improved process for forming a printed circuit board having a buffer, or transition, layer with compressive deposit or neutral stress.

It is still another object of this invention to provide an improved printed circuit board having a buffer, or transition, layer of conductive material with compressive or neutral deposit stress that underlies a layer of conductive material with tensile deposit stress.

It is still another object of this invention to provide an improved process for forming a printed circuit board having a buffer layer of conductive material applied by abrupt application of appropriate current density.

With these and objects in view, which will become apparent to one skilled in the art as the description proceeds, this invention resides in the novel construction, combination, arrangement of parts and method substantially as hereinafter described and more particularly defined by the appended claims, it being understood that changes in the precise embodiment of the herein disclosed invention are meant to be included as come within the scope of the claims.

DESCRIPTION OF THE INVENTION

In the preferred process of making printed circuit boards according to this invention, a dielectric substrate has a plurality of layers of electrically conductive material, (normally copper with copper being utilizable throughout as the deposited conductive material) deposited thereon. While not mandatory, the substrate preferably has holes (as needed for connection of the conductive pattern to be provided on the board to conductive patterns and/or components at opposite sides of the board) placed in the substrate, as by drilling, for example, prior to deposite of any conductive material onto the substrate.

A first thin layer, or film, of conductive material is preferably first sputtered onto the substrate (and through the holes, if any, in the board), after which the substrate having the sputtered layer thereon, is processed to create a crystalline structure in the then amorphous sputtered layer that is suitable to thereafter allow electroplating without damaging the substrate board. If this step is not carried out, electroplating directly onto the sputtered layer has been shown to quickly result in substrate board damage.

Processing of the board, with the sputter layer thereon, can be accomplished chemically or mechanically, and is preferably accomplished by applying a buffer, or transition, layer of conductive material, with neutral or slightly compressive deposit stress, onto the sputter layer in an electroplating bath of appropriate chemistry by abrupt application of optimum current density. Alternately, the crystalline structure of the sputter layer can be accomplished mechanically by annealing the sputtered layer, either through heating, cold working, or shot peening, for example.

After a suitable crystalline structure has been created, an additional layer with non-compressive, or tensile, deposit stress is electroplate onto the buffer layer in a different electroplating bath to achieve uniform conductive material on the substrate surface and through the holes that continues to strongly adhere thereto.

The substrate may be formed form any dielectric material (rigid or flexible) that is normally acceptable for printed circuit board use, and such substrate may be formed, for example, from thermoset plastic, thermoplastic, polymer coated material, ceramic, or glass. Such a substrate typically has a thickness of about one-sixteenth of an inch.

One side (or, more typically, both sides) of the substrate is preferably first coated with copper by sputtering, with the sputtered film forming a hermetic seal on the substrate that is sufficiently thick to carry the current necessary for the subsequent electroplating process without causing significant heating. The sputtered film thickness is preferably between about 40 to 120 millionths of an inch in thickness depending upon the surface roughness of the substrate and the hole diameter to depth ratio. Deposition of the thin film by sputtering is preferably accomplished using high rate, planar magnetron sputtering, using, for example, teachings similar to that taught in U.S. Pat. No. 4,166,018.

Prior to sputtering of the thin conductive film onto the substrate, the stbstrate is preferably first prepared by cleaning. Since the conductive material deposited by sputtering is subject to oxidation, it has been found preferable to immediately electroplate a buffer layer onto the sputtered film layer (or, alternately, to immediately image and plate the pattern not covered by photoresist). Accordingly, normal cleaning steps are not utilized and the substrate with the sputtered layer thereon is preferably immersed in the electroplating bath immediately after sputtering is completed (unless immediate imaging and plating of the pattern not covered by photoresist is carried out before initial electroplating).

The surface roughness of the sputtered copper film depends upon the roughness and porosity of the substrate surface. If the substrate surface roughness or sputtered copper film porosity are excessive, there is little chance for electropolating without a substantial loss of adhesion. If the sputtered substrate passes a simple mild acid dip porosity test without loss of adhesion, however, then it is likely that good adhesion can be maintained throughout electroplating to produce an acceptable finished circuit board.

After sputtering a thin layer of copper onto the surface and through the holes, if any, of the substrate, it is often necessary to build the thin copper film into a thicker overall layer for use as an electrical conductor. This further buildup of copper is, however, generally selective, and a coating of plating resist material would leave the copper exposed only in the image of the desired circuit board.

It has been found that the adhesion of the sputtered copper to the substrate surface can be destroyed by stress in the subsequently applied electroplated layer. Different plating parameters can be altered to change the stress characteristics of the deposit, and it has been found that copper deposits may be obtained with tensile stress, zero stress, or compressive stress. It has also been found, however, that consistent operation of the plating system to obtain a deposit with zero stress is quite difficult, and even if a stress-free deposit is obtained, other characteristics of the deposit still may not be suitable for printed circuit board applications (such as, for example, by forming a coating in a bath with poor throwing power wherein the ratio of copper thickness on the surface and in the holes of the coating is poor).

The method of this invention overcomes the adhesion problem of conductive layers to non-conductive surfaces by creating a crystalline structure in the amorphous sputtered layer. While this may be accomplished mechanically, as brought out above, it has been found that creation of the crystalline structure can also be accomplished by plating a thin buffer, or transition, layer of copper over the sputtered layer (with the thickness of the buffer layer being one to five times the thickness of the sputtered layer) in a plating bath that provides a layer that has slightly compressive or neutral deposit stress.

Such an electroplating bath may be, for example, a standard composition acid-copper sulfate bath such as shown in Table 7.2 of Printed Circuits Handbook by Coombs. As set forth therein, standard and high throwing power compositions for an acid-copper sulfate bath are as follows:

| Component | Standard | | High Throwing Power | |
|---|---|---|---|---|
| | g/L | oz/gal | g/L | oz/gal |
| Copper sulfate, $CuSO_4$ $5H_2O$ | 160–300 | 24–40 | 60–90 | 8–12 |
| Copper, $Cu^{+2}$ | 40–75 | 6–10 | 15–22.5 | 2–3 |
| Sulfuric acid, $H_2SO_4$ | 52.5–135 | 7–18 | 187.5–225 | 25–30 |
| Addition agents | As required | | As required | |
| Chloride ion | 20–80 ppm | | 20–80 ppm | |
| Operating Conditions | | | | |
| Temperature, °F. | | | 65–90 | |
| Cathode current $A/ft^2$ | | | 25–50 | |
| Agitation | | | Blower air | |
| Anodes | | | Phosphorized copper (0.02–0.08% P) | |
| Anode bags | | | Dynel or polypropylene | |
| Filtration | | | Continuous or occasional | |

While the standard composition bath has been found to be useful for decorative purposes, it has not, heretofore, been found to be useful for elecrtroplating of layers of copper inside holes as a part of forming printed circuit boards. The high throwing power composition has, however, been normally used heretofore for electroplating layers of copper for forming printed circuit boards.

It has been found preferable, in forming a printed circuit board according to this invention, that the substrate having a layer of sputtered copper thereon, be placed in the standard composition electroplating bath in the absence of application of electrical power to the bath. The electrical power is then abruptly applied (normally by closing a switch to the power supply) so that the initial current density applied is near 25 amps per squae foot (an initial current density of up to 60 amps per square foot may be advantageously applied for the first few seconds). Plating in the standard composition bath is continued until the bath (i.e., the microleveling agents in the normal additives in the bath) produces a smooth, bright copper appearance on the buffer layer.

The deposition of the buffer layer of copper over the sputtered adhesion layer prevents damaging the board (as would be caused through destruction of the adhesion of the sputtered layer to the substrate) by creating a crystallne structure in the sputtered layer. Substrate to metal adhesion can either improve slightly with time or diminish in proportion to stress built up by further deposition of copper.

It has been found that electroplating copper having neutral or slightly compressive stress over sputtered copper films on most typical substrates at low current density destroys adhesion to the substrate below about 15 amperes per square foot (down to milliamperes per square foot) within seconds. Copper deposited at low current density and corresponding lower voltage is expected to be highly stressed due to co-deposition of organic contaminates and metallic impurities that are more significant at low deposition rates while copper deposited at higher current density may be more stressed due to hydrogen or other gas entrapment at the cathode surface.

The surface of a sputtered film of copper is, therefore, very sensitive to the nature of the first growth of an electro-deposited film of copper. In thirty seconds at 25 amperes per square foot, copper deposition is normally only about ten to fifteen millionths of an inch, and the adhesion to the substrate has been found to be destroyed in 30 seconds at 1/100th of this current density. It appears that he sputtered film structure is changed from the surface down to the substrate and this transition destroys adhesion. This transition can, however, be avoided, or directed in a positive direction, through the use of the process of this invention.

If the sputtered copper surface is rough, it will have greater surface area. Surface porosity will also increase surface area. Excess surface area will, however, change the current density required, and surface texture differences may also require change of bath chemistry and optimum buffer layer thickness.

The sputtered copper film may initially be considered to be amorphous. The growth of an electro deposited layer of copper may initiate a matching structural alignment from the surface of the sputtered film to the substrate interface. The growth of the buffer film might also create a structural alignment of the sputtered film which is not as detrimental to adhesion at the substrate interface, and it might have little structural effect on a sputtered film. The structure of the buffer film is, however, well established and shields the underlying sputtered film from any drastic transition.

By way of example, printed circuit boards were fabricated from injeciton molded thermal plastic substances as the substrate. The substrate utilized was 30% glass filled polyetherimide (resin) which had been molded to form the outline and whole pattern of an IPC 25 test coupon (i.e., a test coupon created by the Institute for Interconnecting and Packaging Electronic Circuits as a standard test coupon for evaluation of two-sided plated hole printed wiring boards). The dimensions of the substrate were $4''\times 5''\times 0.0625''$. The samples were cleaned, dried, plasma magnetron sputtering to deposit a film of copper between two and three microns thick onto the surface.

Selected ones of the thus prepared test coupons were then checked for porosity and adhesion (the test coupons used for checking porosity and adhesion were not later used in further processing). Adhesion of the copper film was tested by tape pull using standard tape (5 to 6 pounds per inch of width adhesion) and a special tape (11 to 12 pound per inch of width adhesion). The area tested was cross hatched with a razor blade. No copper was pulled by either tape except for the edges of the razor cuts. Since the razor cuts penetrated and deformed the plastic substrate, it was demonstrated that the adhesion of the film to the surface exceeded the tensile strength of the film as well as the strength of the tape bond.

After testing for adhesion, the copper film was then tested for porosity. The samples were immersed in a solution of 10% sulphuric acid for one minute and then rinsed and dried. As the surface dried under a jet of dry nitrogen, it was observed that no moisture remained after the surface was stripped. A porous surface would remain wet after the surface moisture was removed. Tape tests were then conducted identical to the initial tape tests.

After successful testing for adhesion and porosity, the boards not selected for porosity and adhesion testing were immersed in a standard composition electroplating bath with the electrical power off. The electrical current was abruptly applied at a preset current density of 25 amps per square foot. After 5 minutes, the current was switched off, and the samples were placed in a high throw electroplating bath. The samples were plated in the high throw electroplating bath at 25 amps per square foot for 40 minutes. This produced a total copper thickness of over 0.001 inches which is suitable for most applications. The adhesion of the copper was found to be significant better than can be obtained without plating the buffer layer onto the sputtered copper.

In tests using a standard 267 ml Hull Cell, it was demonstrated that adhesion of a layer of copper directly electroplated onto a substrate was destroyed in a five minute test with a high throwing power copper bath. The cell current was 1 ampere and adhesion loss covered the entire panel. It was also demonstrated that a 30 second test produced the same adhesion loss.

The substrate surface was disrupted and particles of substrate remained bonded to the peeled off copper film. A sample was placed in the standard 267 ml Hull Cell for five minutes without turning on the current. It was removed, rinsed, dried and tested for adhesion. No adhesion loss occurred due to the soaking.

The Hull Cell test was repeated with a standard acid copper bath formulation containing 2.5% of $H_2SO_4$ (or less) and 32 ounces per gallon $CuSO_4\ 5H_2O$. A neutral or slighly compressive stress was produced with this formulation. Adhesion to the substrate remained good after both five minutes and thirty second tests over the 15–60 ampere per square foot range. it was also shown that the 1 amp cell current had to be applied by presetting the current level on a test sample strip and switching on the current quickly. Application of current by turning up the output of the power supply to 1 amp level caused loss of adhesion.

Further plating of samples in a Hull Cell with a high throw formulation for forty minutes produced good adhesion and appeared best around 25 amperes per square foot. A tensile stress of 750–1500 psi was produced with this formulation.

While described herein in connection with initial application of conductive material to a substrate, it is meant to be realized that the method of this invention could also be utilized to deposit conductive layers on plastic surfaces provided between layers, as, for example, where multiple layer printed circuit boards are formed.

It should be appreciated from the foregoing that this invention provides an improved method for forming a printed circuit board wherein improved adhesion of conductive layers to a substrate is achieved, with the invention having been described herein according to the best mode so far devised for the practical application of the principles thereof.

What is claimed is:

1. A method for forming a printed circuit board, said method comprising:
   providing an electrically non-conductive surface;
   sputtering a thin layer of electrically conductive material onto said surface so that said conductive material adheres to said surface;
   creating a crystalline structure in said sputtered layer suitable for electroplating without appreciable loss of adhesion of said sputtered layer to said surface; and
   electroplating a layer of electrically conductive material having tensile deposit stress onto said created crystalline structure in said sputtering layer to thereby form an electrically conductive coating that is strongly adhered to said surface.

2. The method of claim 1 wherein said conductive material is copper that is sputtered onto said surface using planar magnetron sputtering.

3. The method of claim 1 wherein said step of creating said crystalline structure n said sputtered layer is accomplished by one of chemical and mechanical application.

4. The method of claim 1 wherein said crystalline structure on said sputtered layer is accomplished by electroplating a buffer layer of electrically conductive material having one of neutral and compressive deposit stress onto said sputtered layer of conductive material.

5. The method of claim 4 wherein said buffer layer is electroplated using a predetermined current density that is abruptly applied.

6. The method of claim 5 wherein said method includes providing a predetermined current density of no less than about 25 amps per square foot and applying said current density to about 5 minutes.

7. The method of claim 4 wherein said buffer layer is copper electroplated onto said sputtered layer using a standard composition electroplating bath.

8. The method of claim 4 wherein said sputtered layer is between about 40 and 120 millionths of an inch in thickness, and wherein said buffer layer is 1 to 5 times the thickness of said sputtered layer.

9. The method of claim 1 wherein said electroplated layer is copper electroplated onto said created crystalline structure in said sputtered layer using a high throwing power composition electroplating bath.

10. The method of claim 9 wherein said method includes copper electroplating in said high throwing composition electroplating bath at about 25 amps per square foot for about 40 minutes.

11. A method for forming a printed circuit board, said method comprising:
    providing an electrically non-conductive substrate;
    adhering a thin film of electrically conductive material onto said substrate by sputtering;
    providing a first electroplating bath and immersing said substrate with said sputtered film thereon into said first electroplating bath;
    abruptly applying optimum density current to cause electroplating of a buffer layer having compressive deposit stress onto said sputtered layer on said substrate immersed in said first electroplating bath;
    providing a second electroplating bath and immersing said substrate with said sputtered and buffer layers thereon into said second electroplating bath; and
    electroplating an additional layer of electrically conductive material having non-compressive deposit stress onto said buffer layer on said substrate immersed in said second electroplating bath to thereby form a uniform and strongly adhering electrically conductive coating on said substrate.

12. The method of claim 11 wherein said first electroplating bath is a standard composition acid-copper sulfate bath, and wherein said second electroplating bath is a high throwing power composition acid-copper sulfate bath.

13. The method of claim 11 wherein said sputtered film is between 40 and 120 millionths of an inch in thickness, and wherein the total thickness of said sputtered film and said buffer layer is at least about 0.001 inches.

14. The method of claim 11 wherein said substrate has holes therein, and wherein said sputtering layer and said buffer and additional layers of conductive material are deposited in said holes in sufficient thickness so as to be acceptable for printed circuit board usage.

15. A method for forming a printed circuit board, said method comprising:
    providing a dielectric substrate having opposite surfaces with holes extending through said substrate and opening to said surfaces;
    sputtering a thin film of copper up to 120 millionths of an inch in thickness onto said surfaces and the walls of said holes with said copper adhering thereto;
    providing a standard composition electroplating bath and immersing said substrate with said copper sputtered thereon into said standard composition bath;
    abruptly applying a current having a density of at least about 25 amperes per square foot for about five minutes to cause a buffer layer to be deposited onto said sputtered layer on said surfaces and on the walls of said holes of said substrate immersed in said standard composition of electroplating bath with said copper layer achieving a thickness of about 1 to 5 times that of said sputtered layer;
    providing a high throwing power electroplating bath and immersing said substrte with said sputtered film and buffer layer thereon into said high throwing power electroplating bath; and applying a current having a density of at least about 25 amperes per square foot for about 40 minutes to said buffer layer and said surfaces of said walls of said substrate immersed in said high throwing power composition bath to thereby achieve a uniform copper coating that strongly adheres to said substrate.

* * * * *